(12) United States Patent
Rupp et al.

(10) Patent No.: US 10,615,040 B2
(45) Date of Patent: Apr. 7, 2020

(54) SUPERJUNCTION STRUCTURE IN A POWER SEMICONDUCTOR DEVICE

(71) Applicant: Infineon Technologies AG, Neubiberg (DE)

(72) Inventors: Roland Rupp, Lauf (DE); Alexander Breymesser, Villach (AT); Andre Brockmeier, Villach (AT); Ronny Kern, Finkenstein (AT); Francisco Javier Santos Rodriguez, Villach (AT); Carsten von Koblinski, Villach (AT)

(73) Assignee: Infineon Technologies AG, Neubiberg (DE)

( * ) Notice: Subject to any disclaimer, the term of this patent is extended or adjusted under 35 U.S.C. 154(b) by 59 days.

(21) Appl. No.: 15/616,117

(22) Filed: Jun. 7, 2017

(65) Prior Publication Data
US 2017/0358452 A1 Dec. 14, 2017

(30) Foreign Application Priority Data

Jun. 8, 2016 (DE) .................. 10 2016 110 523

(51) Int. Cl.
*H01L 21/266* (2006.01)
*H01L 21/265* (2006.01)
(Continued)

(52) U.S. Cl.
CPC ........ *H01L 21/266* (2013.01); *H01L 21/2654* (2013.01); *H01L 21/26506* (2013.01);
(Continued)

(58) Field of Classification Search
CPC .............. H01L 21/266; H01L 21/0334; H01L 21/0465; H01L 51/002; H01L 21/76817;
(Continued)

(56) References Cited

U.S. PATENT DOCUMENTS 6,346,464 B1   2/2002  Takeda et al.
8,710,620 B2 * 4/2014  Schulze ............. H01L 29/0619
                                                    257/514
(Continued)

FOREIGN PATENT DOCUMENTS

DE    602004005210 T2   11/2007
DE    102015202121 A1    8/2016
(Continued)

OTHER PUBLICATIONS

Rüb, M., et al., "550 V Superjunction 3.9 SImm2 Transistor Formed by 25 MeV Masked Boron Implantation", Proceedings of 2004 International Symposium on Power Semiconductor Devices & ICs, Kitakyushu, 2004, pp. 455-458.

*Primary Examiner* — Latanya N Crawford
(74) *Attorney, Agent, or Firm* — Murphy, Bilak & Homiller, PLLC (57) ABSTRACT

A method of processing a power semiconductor device includes: providing a semiconductor body of the power semiconductor device; coupling a mask to the semiconductor body; and subjecting the semiconductor body to an ion implantation such that implantation ions traverse the mask prior to entering the semiconductor body.

11 Claims, 6 Drawing Sheets

(51) Int. Cl.
  *H01L 21/311* (2006.01)
  *H01L 29/36* (2006.01)
  *H01L 21/04* (2006.01)

(52) U.S. Cl.
  CPC ........ *H01L 21/31111* (2013.01); *H01L 29/36* (2013.01); *H01J 2237/31701* (2013.01); *H01L 21/0465* (2013.01); *H01L 21/26513* (2013.01); *H01L 21/26546* (2013.01)

(58) Field of Classification Search
  CPC ............... H01L 29/36; H01L 21/31111; H01L 21/2654; H01L 21/26506; H01L 21/26513; H01L 21/26546; H01J 2237/31701
  See application file for complete search history.

(56) References Cited

U.S. PATENT DOCUMENTS

| | | | | |
|---|---|---|---|---|
| 2006/0286490 | A1* | 12/2006 | Sandhu | B82Y 10/00 430/394 |
| 2009/0263729 | A1* | 10/2009 | Sinha | B82Y 10/00 430/5 |
| 2010/0233871 | A1* | 9/2010 | Chuang | H01L 21/26513 438/527 |
| 2012/0248566 | A1* | 10/2012 | Bobde | H01L 29/0615 257/487 |
| 2012/0273916 | A1 | 11/2012 | Yedinak et al. | |
| 2013/0011947 | A1* | 1/2013 | Yanagisawa | G02B 5/18 438/29 |
| 2013/0052835 | A1* | 2/2013 | Kobayashi | G03F 7/0002 438/758 |
| 2014/0021590 | A1* | 1/2014 | Schulze | H01L 29/0619 257/655 |
| 2014/0167205 | A1* | 6/2014 | Chang | H01L 29/0634 257/494 |
| 2015/0357406 | A1* | 12/2015 | Guan | H01L 29/0634 257/493 |
| 2016/0233295 | A1 | 8/2016 | Schulze et al. | |
| 2017/0069712 | A1* | 3/2017 | Schustereder | C23C 14/48 |
| 2017/0076947 | A1* | 3/2017 | Uehara | H01L 21/02529 |
| 2018/0006147 | A1* | 1/2018 | Weber | H01L 21/26586 |

FOREIGN PATENT DOCUMENTS

| | | |
|---|---|---|
| EP | 0014516 B1 | 3/1983 |
| JP | 2001144292 A | 5/2001 |
| JP | 2004160647 A | 6/2004 |
| JP | 2007317833 A | 12/2007 |
| JP | 2010171162 A | 8/2010 |
| JP | 2010186820 A | 8/2010 |
| JP | 2016021547 A | 2/2016 |

* cited by examiner

SUPERJUNCTION STRUCTURE IN A POWER SEMICONDUCTOR DEVICE

TECHNICAL FIELD

This specification refers to embodiments of method of processing a power semiconductor device. Further, this specification refers to embodiments of a power semiconductor device. In particular, this specification is directed to embodiments of a power semiconductor device having a deep semiconductor region, e.g., a deep superjunction structure that has been created by means of implantation.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, the load current path may be controlled by means of an insulated control electrode, sometimes referred to as gate electrode. For example, upon receiving a corresponding control signal from, e.g., a driver unit, the control electrode may set the power semiconductor device in one of a conducting state and a blocking state.

Said power semiconductor devices shall usually have low power losses, e.g., low switching losses and/or low on-state losses, such that said application, e.g., said power supplies and power converters, may exhibit a high efficiency. To this end, compensation structures, which are also referred to as superjunction structures or CoolMOS™ structures, have been proposed. For example, superjunction structures can be established in the semiconductor body by means of carrying out one or more epitaxy processing steps.

Beyond low power losses, said power semiconductor devices shall sometimes simultaneously exhibit high blocking capabilities, e.g., up to 1000 Volts and above, and/or shall be designed for high currents, e.g., up to several hundred Amperes.

SUMMARY

According to an embodiment, a method of processing a power semiconductor device comprises: providing a semiconductor body of the power semiconductor device; coupling a mask to the semiconductor body; subjecting the semiconductor body to an ion implantation such that implantation ions traverse the mask prior to entering the semiconductor body.

According to a further embodiment, a power semiconductor device comprises: a semiconductor body, the semiconductor body comprising a semiconductor body material that exhibits a dopant diffusion coefficient smaller than the dopant diffusion coefficient of silicon; at least one first semiconductor region, the at least one first semiconductor region being doped with dopants of a first conductivity type and exhibiting a columnar shape that extends into the semiconductor body along an extension direction for at least 5 µm, wherein a respective width of the at least one first semiconductor region continuously increases along said extension direction at least one second semiconductor region included in the semiconductor body, the at least one second semiconductor region being arranged adjacent to the at least one first semiconductor region and being doped with dopants of a second conductivity type complementary to the first conductivity type.

According to a yet further embodiment, a power semiconductor device comprises: a semiconductor body, the semiconductor body comprising a semiconductor body material that exhibits a dopant diffusion coefficient that is smaller than the corresponding dopant diffusion coefficient of silicon; at least one first semiconductor region included in the semiconductor body, the at least one first semiconductor region being doped with implanted dopants of a first conductivity type and exhibiting a columnar shape that extends into the semiconductor body along an extension direction for at least 5 µm; at least one second semiconductor region included in the semiconductor body, the at least one second semiconductor region being arranged adjacent to the at least one first semiconductor region and being doped with dopants of a second conductivity type complementary to the first conductivity type, wherein a transition between the first semiconductor region and the second semiconductor region in a first lateral direction perpendicular to the extension direction forms, in a vertical cross-section of the power semiconductor device, a straight line at least along 50% of the total extension of the first semiconductor region along the extension direction.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device, such as a power semiconductor transistor, that may be used within a power converter or a power supply. Thus, in an embodiment, the power semiconductor device is configured to carry a load current that is to be fed to a load and/or, respectively, that is provided by a power source. For example, the semiconductor device may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cell and/or such transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V, e.g., greater than 1 kV, or even greater than 3 kV. For example, the processed power semiconductor device described below may be a semiconductor device exhibiting a stripe cell configuration or a needle cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

Figure 8:
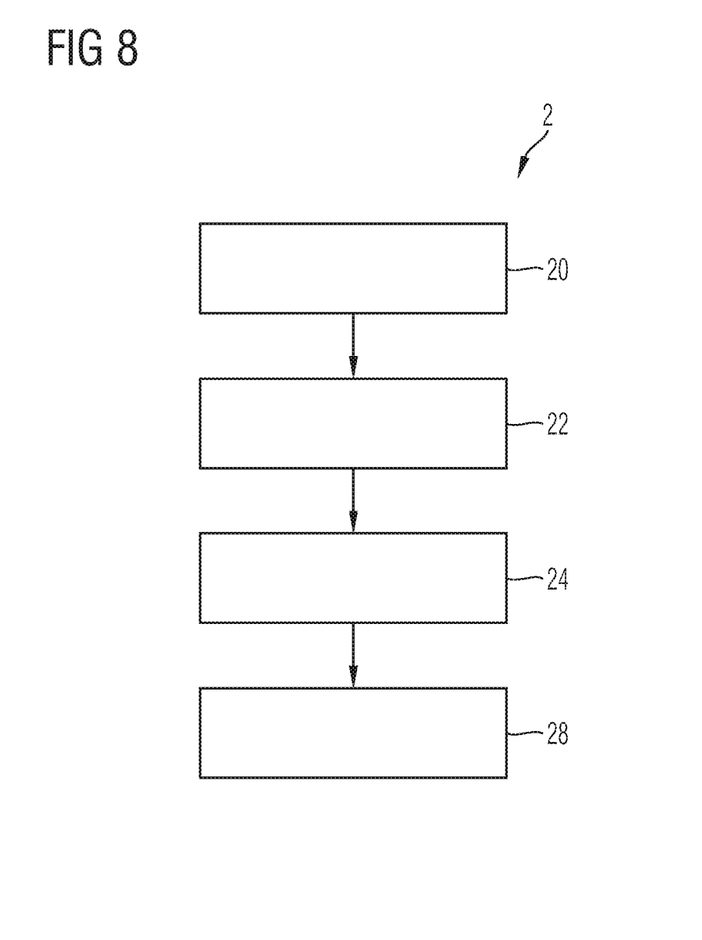
FIG. 8 schematically and exemplarily illustrates a diagram of a method of processing a power semiconductor device in accordance with one or more embodiments.

Each of FIG. 1 to FIG. 5 schematically and exemplarily illustrates, on the basis of a vertical cross-section of a section of a semiconductor body 10, steps of a method 2 of processing a power semiconductor device in accordance with one or more embodiments. FIG. 8 schematically and exemplarily illustrates a diagram of a method of processing a power semiconductor device in accordance with one or more embodiments. If not stated otherwise, the following explanations may pertain to each of said FIGS. 1-5 and 8. Further, the power semiconductor device will also be referred to as simply "semiconductor device".

In a first step 20 (cf. FIG. 8), a semiconductor body 10 may be provided. For example, the semiconductor body 10 may be a part of the semiconductor device 1 and may be provided as a semiconductor wafer. The provided semiconductor body 10 may comprise or, respectively, be made of a semiconductor body material having a dopant diffusion coefficient smaller than the dopant diffusion coefficient of silicon. For example, the semiconductor body material may have a dopant diffusion coefficient at least two orders of magnitude lower than the corresponding dopant diffusion coefficient of silicon. Said diffusion coefficient may comprise at least one of an acceptor diffusion coefficient and a donor diffusion coefficient. The semiconductor body 10 may be made of a material comprising at least one of silicon carbide, gallium nitride, aluminum nitride.

In a step 22 (cf. FIG. 8), a mask 30 may be provided, wherein said step 22 may be carried out prior, simultaneously or subsequently to carrying out step 20. For example, the mask 30 is provided separately from the semiconductor body 10, e.g., at a position separated from the semiconductor body 10. For example, the mask 30 is not provided by depositing a mask material on the surface 10-1 of the semiconductor body 10 or by subjecting the semiconductor body 10 to a thermal oxidation processing step. Thus, in an embodiment, the mask 30 does not include a deposited oxide, but the mask 30 may be provided separately from the semiconductor body 10 and may be structured by means of a chemical, mechanical and/or a photochemical process, before and/or after being coupled to the semiconductor body 10, wherein said structuring will be explained in more detail below.

In a next step 24 (cf. FIG. 8), the provided mask 30 can be coupled to the semiconductor body 10. Thus, in view of the explanations in the preceding paragraph, it shall be understood that, in accordance with one or more embodiments, the step of providing the mask 30 is carried out separately from the step of coupling the mask 30 to the semiconductor body 10. For example, providing the mask 30 is not carried out simultaneously to coupling the mask 30 to the semiconductor body 10, e.g., the mask 30 is provided in a first time interval and, in a second time interval different from the first time interval, the mask 30 is coupled to the semiconductor body 10.

In an embodiment, coupling the mask 30 to the semiconductor body 10 may include mounting the mask 30 on the semiconductor body 10, e.g., such that the mask 30 is in contact with the semiconductor body 10, e.g., the mask 30 may be mounted on the surface 10-1 of the semiconductor body 10 such that there is substantially no distance between the surface 10-1 and the semiconductor body 10.

Further, coupling the mask 30 to the semiconductor body 10 may include at least one of a bonding step and an adhesion processing step. For example, the bonding step may include an anodic bonding. The adhesion processing step may include a warm adhesion processing step. For example, if the mask 30 is a glass mask, the adhesion processing step may be carried out at the temperature near to the glass-transition temperature of the mask 30, e.g., at a temperature amounting to at least 90%, to at least 94%, or to at least 96% of the glass-transition temperature of the mask 30. Further exemplary materials of the mask 30 will be described in more detail below.

In another step 28 (cf. FIG. 8), the semiconductor body 10 may be subjected to an ion implantation such that implantation ions traverse the mask 30 prior to entering the semiconductor body 10. As has been explained above, in an embodiment, coupling the mask 30 to the semiconductor body 10 may include mounting the mask 30 on the semiconductor body 10, e.g., such that the mask 30 is in contact with the semiconductor body 10 during the ion implantation, e.g., the mask 30 may be mounted on the surface 10-1 of the semiconductor body 10 such that there is substantially no distance between the surface 10-1 and the semiconductor body 10 during the ion implantation. Thus, for example, the mask 30 is not positioned spatially separated from the semiconductor body 10 during the ion implantation.

For example, method 2 may allow for providing a drift volume in a semiconductor body 10, e.g., a SiC based semiconductor body, having a superjunction structure (also referred to as compensation structure) that extends into the semiconductor body 10 for a certain depth. It shall be understood that each of the steps mentioned above, e.g., the ion implantation, may be repeated several times, e.g., using different masks or the same mask 30, and that the method 2 may further include applying one or more epitaxy processing steps. Thus, the structure established in the semiconductor body 10, e.g., a superjunction structure, may exhibit a corresponding large total extension in the extension direction Z or, respectively, the structure elements may repeat along the extension direction Z.

The implantation ions may be provided by an implantation apparatus (not illustrated). For example, referring to FIG. 6 which schematically and exemplary illustrates a section of vertical cross-section of power semiconductor device 1 having the semiconductor body 10, implantation ions 40 may traverse the semiconductor body 10 along an extension direction Z, e.g., for at least 3 μm, or for at least 5 μm, measured from the surface 10-1 of the semiconductor body 10. This traversing distance of the implantation ions within the semiconductor body 10 may be even greater than 5 μm, e.g., greater than 6 μm, greater than 8 μm or even greater than 10 μm. During the implantation, the mask 30 may be coupled to the semiconductor body 10, e.g., to the surface 10-1 of the semiconductor body 10, as exemplarily illustrated in FIG. 6 and each of FIGS. 1 to 5. For example, the ion implantation is a high energy ion implantation, e.g., carried out with an ion energy greater than 400 keV, greater than 2 MeV, e.g., greater than 5 MeV or even greater than 10 MeV. Due to said implantation, the ions 40 may traverse the semiconductor body 10 at least 5 μm along the extension direction Z.

In an embodiment, during carrying out the ion implantation with an ion energy greater than 2 MeV, the total thickness DZ of the mask 30 along the extension direction Z may be within the range of 5 μm to 50 μm, within the range of 7 μm to 40 μm, or within the range of 10 μm to 20 μm. For example, the total thickness DZ of the mask 30 along the extension direction Z is greater than 1.2 times of an implantation depth (cf. e.g., level z2 mentioned below with respect to FIG. 6).

The mask 30 may be a glass mask. For example, the mask comprises at least one of:
a borosilicate glass,
a soda-lime glass,
a float glass,
a quartz glass,
a porcelain,
a polymer thermoplastic,
a polymer glass, an acrylic glass,
polycarbonate,
polyethylene terephthalate,
an undoped silica,
a silica doped with at least one dopant, the at least one dopant being selected from the group consisting of boron (B), sodium (Na), calcium (Ca), potassium (K), aluminum (Al), zinc (Zn), copper (Cu), magnesium (Mg), and germanium (Ge),
a polymer,
polynorbornene,
polystyrene,
polycarbonate,
polyimide,
benzocyclobutene, and
parylene.

The mask 30 may be configured to be stable in form in a temperature range that is present during the ion implantation 28. For example, the mask 30 is a glass mask 30 and may have a glass-transition temperature, e.g., of at least 1000° C.

In accordance with another embodiment, the mask 30 may also be made of a material other than glass, e.g., the mask 30 may be made of a metal or a semiconductor.

Further, the mask 30 may exhibit a thermal expansion coefficient that is within the range of 80% to 120% of the thermal expansion coefficient of the semiconductor body 10. This may insure a robust mechanical coupling between the mask 30 and the semiconductor body 10 during further processing of the mask-semiconductor-arrangement 10, 30, e.g., during eventual high-temperature processes. Said range may be narrower than said 80% to 100%; e.g., the thermal expansion coefficient of the mask 30 may also be in the range of 90% to 100%, of 95% to 105% or even within the range of 98% to 102% or even within the range of 99% to 101%.

In an embodiment, the method 2 may further include, in step 24 (cf. FIG. 8) structuring the mask 30 prior and/or subsequently to coupling the mask 30 to the semiconductor body 10. Exemplary ways of structuring the mask 30 shall now be explained with respect to FIGS. 1-5.

Figure 1:
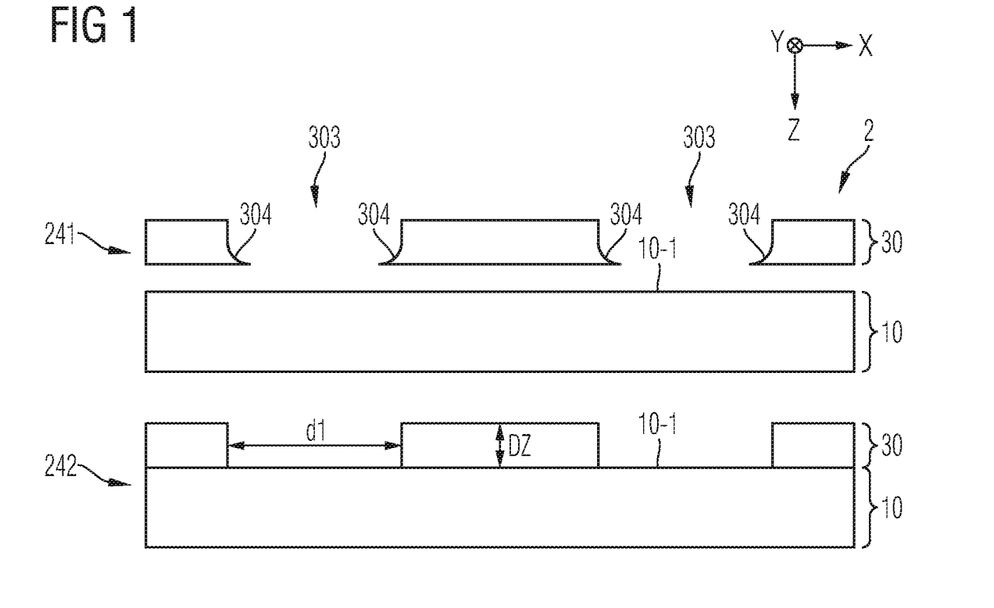
FIG. 1 schematically and exemplarily illustrates, on the basis of a vertical cross-section of a section of a semiconductor body, steps of a method of processing a power semiconductor device in accordance with one or more embodiments.

In accordance with the embodiment schematically illustrated in FIG. 1, the mask 30 may be provided and structured entirely separately from the semiconductor body 10, i.e., prior to coupling the mask 30 to the semiconductor body 10. For example, in step 241, the mask 30 is structured, e.g., by carrying out an etch processing step, e.g., a wet and/or dry etch processing step, and/or an imprint step, e.g., a hot embossing processing step. For example, within structuring the mask 30 in step 241, openings 303 may be created within the mask 30. Thus, the mask 30 may be provided as a contiguous grid, e.g., a monolithic grid, and may be as such coupled to the semiconductor body 10, in accordance with an embodiment. For example, one or more of the openings 303 exhibit a width d1 along the first lateral direction X within the range of 1 μm to 10 μm. Depending on how the structuring of the mask 30 is carried out, corners 304 of the openings 303 can be slightly rounded, as schematically illustrated in the upper part of FIG. 1. In accordance with one or more embodiments, said roundings can be removed, e.g., by carrying out at least one of a grinding processing step, a dry etch processing step and a polishing processing step. Thus, as schematically illustrated in the lower part of FIG. 1, the openings 303 of the mask 30 may be laterally confined by sections of the mask 30 that are arranged substantially perpendicular to the surface 10-1 of the semiconductor body 10.

After the mask 30 has been structured in step 241, the mask 30 may be coupled, in step 242, to the semiconductor body 10. As has been explained more generally above, this coupling may include, e.g., a bonding step, e.g., an anodic bonding step. For example, the mask 30 may substantially cover the surface 10-1 of the semiconductor body 10, whereas the surface 10-1 of the semiconductor body 10 may be exposed in those regions where the mask 30 exhibits said openings 303. Then, after the mask 30 has been coupled to the semiconductor body 10, the ion implantation may be carried out.

The mask 30 may be configured to carry out those functions that a mask usually has to fulfill when being used for implantation purposes. For example, the implantation ions 40 (cf. FIG. 6) are prevented from entering the semiconductor body 10 by the mask 30 in regions, where the mask 30 does not exhibit any openings 303, and ions may enter the semiconductor body 10 in regions, where the mask 30 does exhibit said openings 303. Thereby, certain semiconductor structures, e.g., doped regions may be established within the semiconductor body 10.

It shall further be understood that, in contrast to the schematic illustration in FIG. 1, the mask 30 may comprise a contiguous (monolithic) mask body, e.g., the sections of the mask 30 illustrated in FIG. 1 may actually converge along the second lateral direction Y.

Figure 2:
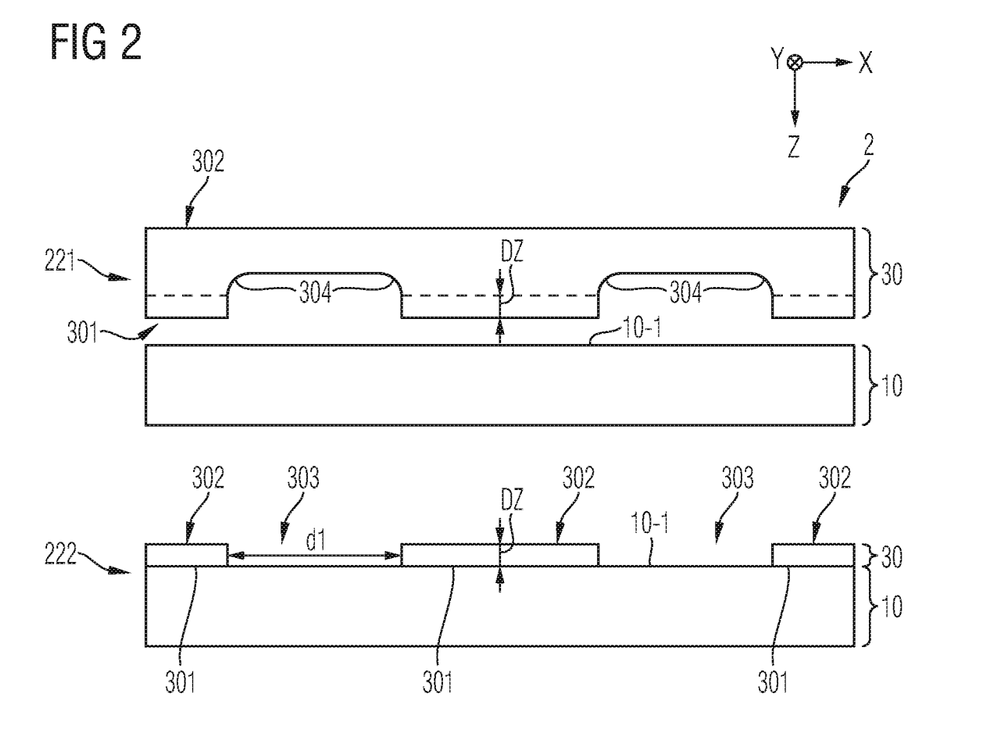
FIG. 2 schematically and exemplarily illustrates, on the basis of a vertical cross-section of a section of a semiconductor body, steps of a method of processing a power semiconductor device in accordance with one or more embodiments.

In accordance with the embodiment illustrated in FIG. 2, the method 2 may comprise a structuring of the mask 30 that includes, prior to coupling (c.f. step 24) the mask 30 to the semiconductor body 10, carrying out, in step 221, at least one of an etch step and an imprint step on a front side 301 of the mask 30. For example, the etch step is a wet etch step. Further, a hard mask may be employed for structuring the front side 301 of the mask 30. For example, within structuring the front side 301 of the mask 30 in step 221, openings 303 may be created within the mask 30. Depending on how the structuring of the mask 30 is carried out, e.g., by means of a wet etch process using a hard mask and a lithography processing step, corners 304 of the openings 303 can be slightly rounded, as schematically illustrated in the upper part of FIG. 2.

Still referring to FIG. 2, after the front side 301 has been structured, the mask 30 may be coupled, in step 24, to the semiconductor body 10, wherein said coupling may include mounting the front side 301 on the semiconductor body 10, e.g., such that the front side 301 faces the surface 10-1 of the semiconductor body 10. Said coupling can be carried out, e.g., by bonding the front side 301 to the surface 10-1 of the semiconductor body 10. Thus, in an embodiment, the mask 30 may be coupled upside-down to the semiconductor body 10.

Still referring to FIG. 2, structuring the mask 30 may further include, prior and/or subsequently to coupling the mask 30 to the semiconductor body 10, in a step 222, removing a portion of the mask 30 from a back side 302 of the mask 30.

Said removing can be carried out, e.g., by means of at least one of an etch step and a glass grinding processing step. For example, removing the portion from the backside 302 of the mask 30 may include removing the roundings 304 that may have been come into being during structuring the front side 301, as schematically illustrated in FIG. 2. Then, the openings 303 may be laterally confined by substantially vertical sections of the mask 30. This may allow for achieving substantially vertical implantation flanks within the semiconductor body 10, which will be explained in more detail below with respect to FIGS. 6-7.

Figure 3:
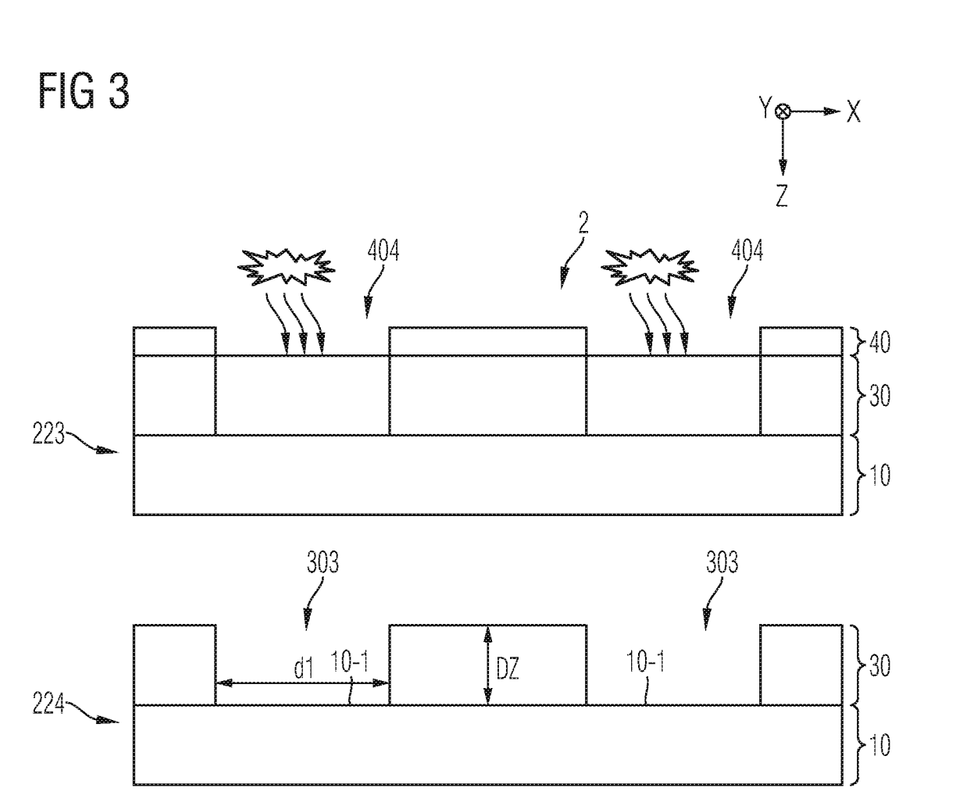
FIG. 3 schematically and exemplarily illustrates, on the basis of a vertical cross-section of a section of a semiconductor body, steps of a method of processing a power semiconductor device in accordance with one or more embodiments.

In accordance with the embodiment of the method 2 schematically illustrated in FIG. 3, the mask 30 can be photo-patternable and structuring the mask 30 may include carrying out an exposure step 223 and a subsequent development step 224. For example, coupling the mask 30 to the semiconductor body 10 is carried out by means of an anodic bonding process. Before or after coupling the mask 30 to the semiconductor body 10, the mask 30 may be covered with a resist layer 40 exhibiting a plurality of openings 404. Thus, the mask 30 may be locally exposed in step 223. The subsequent development step 224 may be carried out without a further mask, e.g., by means of a wet chemical process. Thereby, sections of the mask 30 that were not covered by the resist layer 40 can be removed, thereby creating said openings 303 of the mask 30.

Figure 4:
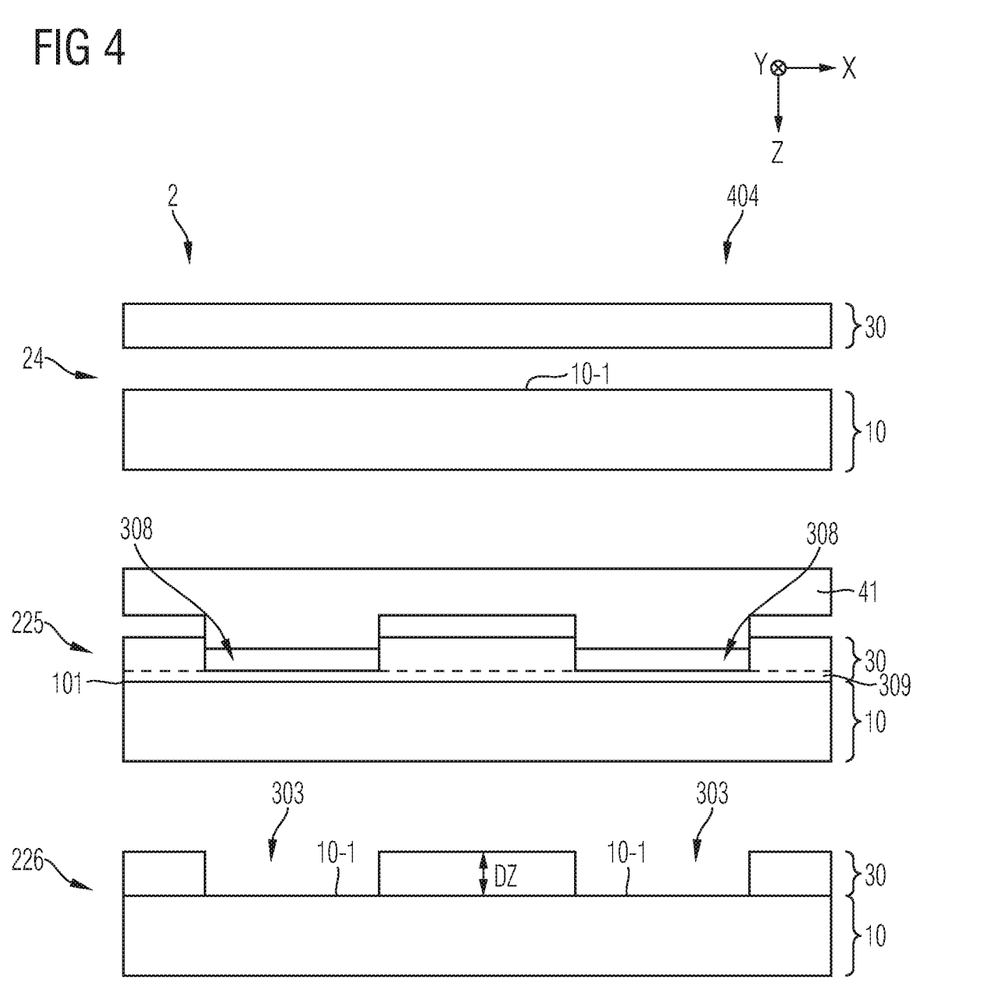
FIG. 4 schematically and exemplarily illustrates, on the basis of a vertical cross-section of a section of a semiconductor body, steps of a method of processing a power semiconductor device in accordance with one or more embodiments.

Regarding now the embodiment schematically illustrated in FIG. 4, the mask 30 may be provided as a wafer, e.g., as a glass wafer, and can be as such coupled to the semiconductor body 10. For example, the wafer 30 is unstructured when being coupled, in step 24, to the semiconductor body 10. In the step 225, i.e., after coupling the mask 30 to the semiconductor body 10, an imprint step can be carried out, e.g., by heating up the mask 30 so as to soften the mask 30, for example to a temperature amounting to at least the glass-transition temperature of the mask 30, and by subsequently pressing a stamp 41 along the extension direction Z into the heated mask 30. The temperature may also be significantly higher than the glass-transition temperature. This may render a structure of the mask 30, as schematically illustrated in the middle portion of FIG. 4, according to which the mask 30 may exhibit recesses 308 caused by the structure of the stamp 41 and according to which the entire surface 10-1 of the semiconductor body 10 may be covered by a base layer 309 of the mask 30. The imprint step 225 can include a hot embossing step. After said imprint step 225, a portion of the mask 30 may be removed so as to create the openings 303 that expose sections of the surface 10-1 of the semiconductor body 10, e.g., by means of wet chemical process, e.g., an etch processing step, so as to remove sections of the base layer 309 beneath said recesses 308. In an embodiment, said removing of the portion of the mask 30 can be carried out without using a further mask.

Figure 5:
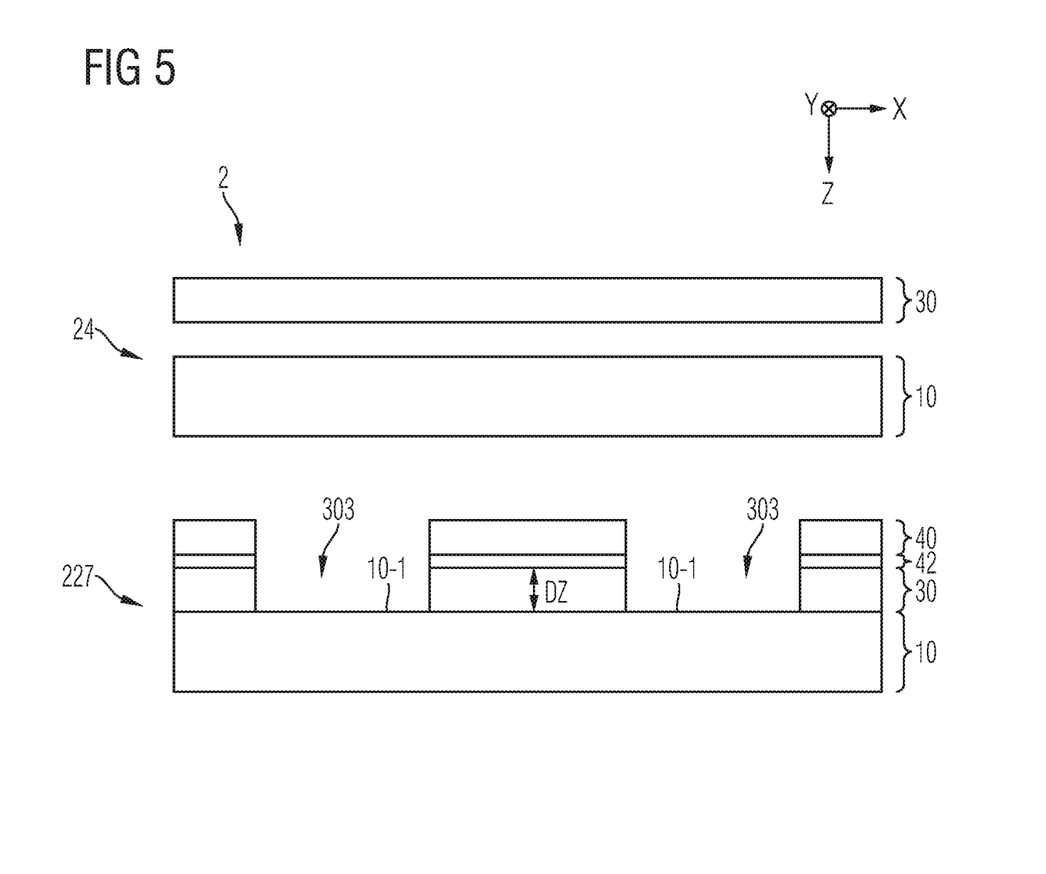
FIG. 5 schematically and exemplarily illustrates, on the basis of a vertical cross-section of a section of a semiconductor body, steps of a method of processing a power semiconductor device in accordance with one or more embodiments.

Regarding now the embodiment of the method 2 schematically illustrated in FIG. 5 the mask 30, which may initially be unstructured, may be coupled, in step 24, to the semiconductor body 10 by means of an adhesion processing step, e.g., a hot adhesion processing step. For example, if the mask 30 is a glass mask, the mask 30 may be heated up to a temperature near the glass transition temperature of the mask 30 and may then be coupled to the semiconductor body 10 by means of a hot adhesion processing step. Afterwards, a hard mask 42 and a resist layer 40 may be mounted on top of the mask 30 when being coupled to the semiconductor body 10. Then, in step 227, the openings 303 that expose sections of the surface 10-1 of the semiconductor body 10 may be formed in the mask 30, e.g., by carrying out at least one of an etch processing step and lithographic processing step.

The embodiments of the method 2 disclosed above may further include, e.g., after carrying out said ion implantation, the step of removing the mask 30 from the semiconductor body 10, for example, so as to facilitate an eventual further processing of the semiconductor device 1. Said removing of the mask 30 can be carried out by a selective etch processing step using, e.g., an etchant based on hydrofluoric acid, and/or by a grinding processing step.

Figure 6:
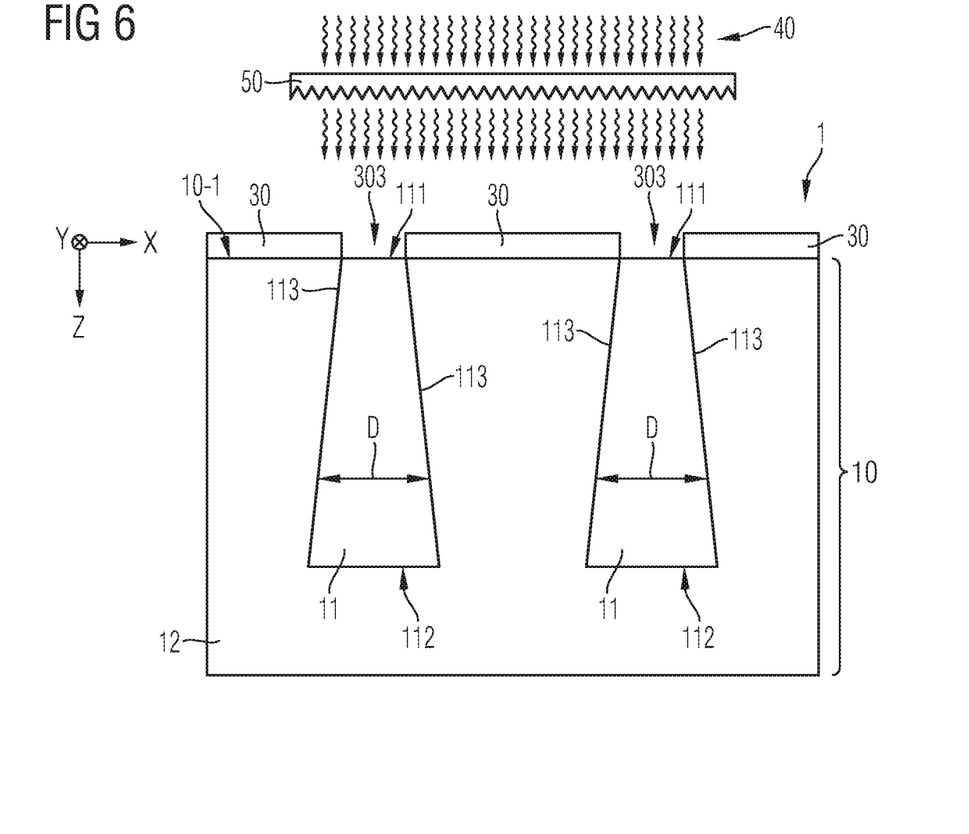
FIG. 6 schematically and exemplarily illustrates a section of a vertical cross-section of a power semiconductor device in accordance with one or more embodiments.
Figure 7:
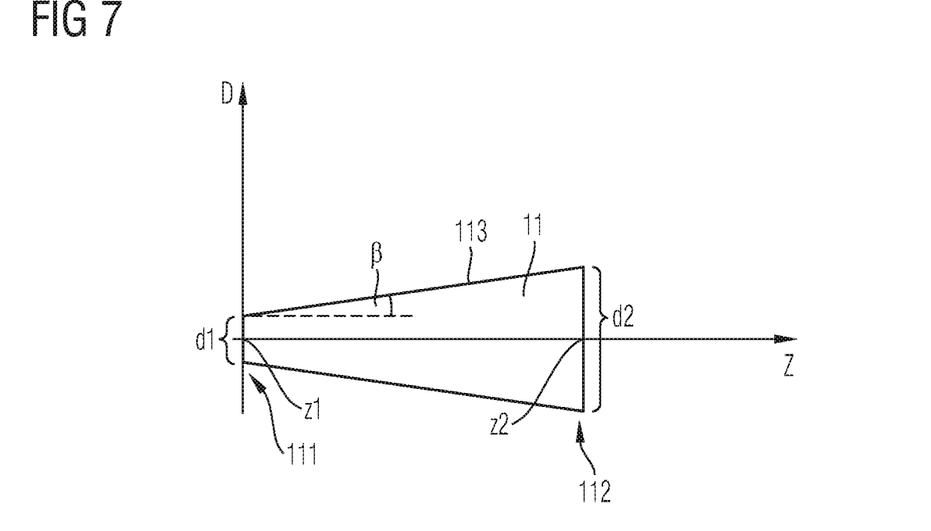
FIG. 7 schematically and exemplarily illustrates a section of a vertical cross-section of a power semiconductor device in accordance with one or more embodiments.

It is now referred to FIGS. 6 and 7, which each schematically and exemplarily illustrate a section of a vertical cross-section of a power semiconductor device 1 in accordance with one or more embodiments. The semiconductor device 1 may comprise a semiconductor body 10. The semiconductor body 10 may comprise or, respectively, be made of a semiconductor body material having a dopant diffusion coefficient smaller than the dopant diffusion coefficient of silicon. For example, the semiconductor body material may have a dopant diffusion coefficient at least two orders of magnitude lower than the corresponding dopant diffusion coefficient of silicon. Said diffusion coefficient may comprise at least one of an acceptor diffusion coefficient and a donor diffusion coefficient. The semiconductor body 10 may be made of a material comprising at least one of silicon carbide, gallium nitride, aluminum nitride.

At least one first semiconductor region 11 may be included in the semiconductor body 10. The at least one first semiconductor region 11 can be doped with dopants of a first conductivity type. For example, the dopants are implanted dopants.

The dopants of the first semiconductor region 11 may have been implanted in accordance with an embodiment of the method 2 presented above. Accordingly, during an ion implantation for forming the at least one first semiconductor region 11 within the semiconductor body 10, a mask 30, as schematically illustrated in FIG. 6, may be mounted on the semiconductor body 10 and the semiconductor body 10 may be subjected to the ion implantation such that implantation ions 40 traverse the mask 30 prior to entering the semiconductor body 10. What has been stated above regarding the mask 30, e.g., for example the way of producing the mask 30, the manner of coupling the mask 30 to the semiconductor body 10 may equally apply to the embodiment of the semiconductor device 1 schematically and exemplarily illustrated in FIG. 6, if not explicitly stated otherwise.

Further, during said ion implantation for forming the first semiconductor region 11, an implantation ion energy filter 50 may be provided and subjecting (cf. step 28) the semiconductor body 10 to the ion implantation can be carried out such that implantation ions 40 traverse each of the implantation ion energy filter 50 and the mask 30 prior to entering the semiconductor body 10. Thus, in more general terms, it shall be understood that, in an embodiment, the method 2, e.g., as illustrated in FIGS. 1-5 and 8, may include providing an implantation ion energy filter and subjecting the semiconductor body 10 to the ion implantation can be carried out such that implantation ions 40 traverse each of the implantation ion energy filter 50 and the mask 30 prior to entering the semiconductor body 10.

The provided implantation ion energy filter 50 may be configured to receive implantation ions 40 and for outputting received implantation ions such that the output implantation ions exhibit a reduced energy as compared to their energy when entering the implantation ion energy filter 50. The implantation ion energy filter 50 may exhibit a structure such that the respective amount of energy reduction depends on the point and/or angle of entry into the implantation ion energy filter 50. Occasionally, the implantation ion energy filter is also being referred to as "energy diffusor". For example, the energy filter 50 is configured to convert a substantially "monochrome" ion beam into an ion beam having a substantially continuous energy spectrum.

Using the implantation ion energy filter 50 may allow for producing the first semiconductor region 11 such that it exhibits a specific dopant concentration profile, e.g., a box profile, i.e., a dopant concentration that is substantially homogeneous along the extension direction Z.

In an embodiment, the first semiconductor region (two of which are illustrated in FIG. 6 as an example) 11 may exhibit a columnar shape that extends into the semiconductor body 10 along the extension direction Z for at least 5 μm. For example, the first semiconductor region 11 may have a proximal end 111, e.g., at a level z1 corresponding to the level of the surface of the semiconductor body 10, and a distal end 112, e.g., at a level z2, and the distance between said ends 111, 112 may amount to at least 5 μm. Said total distance along the extension direction Z may also be greater than 5 μm, e.g., greater than 6 μm, greater than 8 μm, greater than 9 μm, or even greater than 10 μm. For example, the total thickness DZ of the mask 30 along the extension direction Z is greater than 1.2 times of the level z2. Thus, in an embodiment, by carrying out said ion implantation, e.g., including use of at least one of the mask 30 and the implantation ion energy filter 50, the first semiconductor region 11 having the dopants of the first conductivity type and having a total extension along the extension direction Z of greater than 5 μm may be created. Said creation of the first semiconductor region 11 does, for example, not include any epitaxy processing steps, in accordance with one or more embodiments. However, the ions may be implanted into a section of the semiconductor body 10 that may have been created by means of epitaxy.

In an embodiment, a width D of the first semiconductor region 11 may continuously increase along said extension direction Z, as schematically illustrated in each of FIG. 6 and FIG. 7. Thus, for example, the proximal end 111 may exhibit the proximal width d1 and the distal end 112 may exhibit it distal width d2, wherein the with D at every other position between the proximal end 111 and the distal end 112 along with the extension direction Z is larger than the proximal width d1 is smaller than the distal width d2. For example, referring to FIG. 7, a rate of change of the width D of the first semiconductor region 11 may be given by an extension angle β, the extension angle β being identical to an intersection angle at a virtual intersection of said extension direction Z and a junction area of the at least one first semiconductor region 11. The junction area can be a part of the surface 10-1 of the semiconductor body 10 that includes the proximal end 111 of the first semiconductor region 11. For example, the extension angle β is within the range from 0.05° to 3°. Such range may be achieved, e.g., by providing the mask 30 and by coupling the mask 30 to the semiconductor body 10 in accordance with one or more embodiments of the method 2 presented above. For example, the proximal width d1 may be substantially identical to the width d1 of the opening 303 of the mask 30 that may have been coupled to the semiconductor body 10 and that may have been present on the semiconductor body 10 during carrying out the ion implantation.

In accordance with an embodiment, the semiconductor body 10 may further include at least one second semiconductor region 12, the at least one second semiconductor region 12 being arranged adjacent to the at least one first semiconductor region 11 and being doped with dopants of a second conductivity type complementary to the first conductivity type. As indicated above, said at least one first semiconductor region 11 may have been produced by applying at least a first implantation (cf. step 28) of first implantation ions 40. The at least one second semiconductor region 12 may have been produced by carrying out at least one of at least a second implantation of second implantation ions and an epitaxy processing step.

In an embodiment, a transition between the first semiconductor region 11 and the second semiconductor region 12 in the first lateral direction X perpendicular to the extension direction Z may form, in a vertical cross-section of the power semiconductor device 1, a straight line 113 at least along 50% of the total extension of the first semiconductor region 11 along the extension direction Z. The line 113 may be a straight line for more than 50% of said total extension, such as for more than 60%, more than 75%, more than 95% or even more than 98% of said total extension. Correspondingly, junction areas formed by a transition between the first semiconductor region 11 and the second semiconductor region 12 along with the first lateral direction X may exhibit a low waviness for more than 50% of said total extension, such as for more than 60%, more than 75%, more than 95% or even more than 98% of said total extension. For example, such comparatively low waviness, e.g., in terms of said straight line and/or said continuously increasing width, may be achieved by using the mask 30 that has been provided and that has been coupled to the semiconductor body 10 in accordance with an embodiment of the method 2 presented above, according to which the openings 303 of the mask 30 may be laterally confined by substantially vertical sections of the mask 30, e.g., sections of the mask having an edge substantially in parallel to the vertical direction Z. Further, also said implantation ion energy filter 50 mentioned with respect to the exemplary embodiment according to FIG. 6 may contribute to the low waviness, since, as has been mentioned above, the energy filter 50 may be configured to convert a substantially "monochrome" ion beam into an ion beam having a substantially continuous energy spectrum In a yet further embodiment, a dopant concentration of the first semiconductor region 11 along said extension direction Z deviates by less than 50%, or less than 30%, or less than 20%, or less than 10%, or even less than 5% from a fixed value at least along 10% of the total extension of said at least one of the first semiconductor region 11, for example at least along 0.5 μm, at least along 1 μm, or at least along 3 μm, or at least along 5 μm, or even along more than 8 μm in said extension direction Z. Further, at a given depth of said at least one of the first semiconductor region 11 in said extension direction Z, the dopant concentration may be substantially constant along at least 80%, at least 90% or along at least 95% of the width D at said given depth. For example, such substantially homogeneous dopant concentration in the first semiconductor region 11 may be achieved by using a correspondingly structured implantation ion energy filter 50.

For example, the above explained embodiments of the method 2 and the semiconductor device 1 may allow for providing a drift volume in a semiconductor body 10, e.g., a SiC based semiconductor body 10, having a superjunction structure (also referred to as compensation structure) that extends into the semiconductor body 10 for at least 5 μm. For example, such superjunction structure may be formed by the at least one first semiconductor region 11 and the at least one second semiconductor region 12 disclosed above. Further, the processed semiconductor device may be designated for high blocking voltages, e.g., up to 10 kV and above. However, it should be understood, but also other structures than superjunction structure may be established, e.g., deep p-wells in a diode configuration or the like.

In the above, embodiments pertaining to semiconductor device processing methods and power semiconductor devices were explained. For example, these semiconductor devices are based on silicon (Si). Accordingly, a monocrystalline semiconductor region or layer, e.g., the regions 10, 11 and 12 of exemplary embodiments, can be a monocrystalline Si-region or Si-layer. In other embodiments, polycrystalline or amorphous silicon may be employed.

It should, however, be understood that the semiconductor body 10 and components, e.g., regions 10, 11 and 12 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A method of processing a power semiconductor device, the method comprising:
    providing a semiconductor body of the power semiconductor device;
    coupling a glass mask to the semiconductor body;
    subjecting the semiconductor body to an ion implantation such that implantation ions traverse the glass mask prior to entering the semiconductor body; and
    carrying out an imprint step on the glass mask at a temperature of at least the glass-transition temperature of the glass mask, to structure the glass mask,
    wherein:
        prior to coupling the glass mask to the semiconductor body, carrying out the imprint step on a front side of the glass mask;
        coupling the glass mask to the semiconductor body comprises mounting the front side on the semiconductor body; and
        subsequently and/or prior to coupling the glass mask to the semiconductor body, removing a portion of the glass mask from a back side of the glass mask.

2. The method of claim 1, wherein coupling the glass mask to the semiconductor body comprises at least one of a bonding step and an adhesion processing step.

3. The method of claim 1, wherein coupling the glass mask to the semiconductor body comprises mounting the glass mask on the semiconductor body such that the glass mask is in contact with the semiconductor body.

4. The method of claim 1, wherein the glass mask has a thermal expansion coefficient that is within a range of 80% to 120% of the thermal expansion coefficient of the semiconductor body.

5. The method of claim 1, wherein the glass mask is stable in form during the ion implantation.

6. The method of claim 1, wherein the glass mask comprises at least one of:
    a borosilicate glass;
    a soda-lime glass;
    a float glass;
    a quartz glass;
    a porcelain;
    a polymer thermoplastic;
    a polymer glass;
    an acrylic glass;
    polycarbonate;
    polyethylene terephthalate;
    an undoped silica;
    a silica doped with at least one dopant, the at least one dopant being selected from the group consisting of boron, sodium, calcium, potassium, aluminum, zinc, copper, magnesium, and germanium;
    a polymer;
    polynorbornene;
    polystyrene;
    polycarbonate;
    polyimide;
    benzocyclobutene; and
    parylene.

7. The method of claim 1, wherein the ion implantation is carried out for forming at least one of a superjunction structure or a deep well structure within the semiconductor body.

8. The method of claim 1, wherein the ion implantation is carried out such that the implantation ions traverse the semiconductor body for at least 5 µm along an extension direction.

9. The method of claim 1, wherein the semiconductor body comprises a semiconductor body material having a dopant diffusion coefficient smaller than the dopant diffusion coefficient of silicon.

10. A method of processing a power semiconductor device, the method comprising:
    providing a semiconductor body of the power semiconductor device;
    coupling a wafer to the semiconductor body;

subjecting the semiconductor body to an ion implantation such that implantation ions traverse the wafer prior to entering the semiconductor body; and subsequently to coupling the wafer to the semiconductor body, carrying out an imprint step on the wafer at a temperature of at least the glass-transition temperature of the wafer, to structure the wafer.

11. A method of processing a power semiconductor device, the method comprising:

providing a semiconductor body of the power semiconductor device;

coupling a glass mask to the semiconductor body;

subjecting the semiconductor body to an ion implantation such that implantation ions traverse the glass mask prior to entering the semiconductor body; and carrying out an imprint step on the glass mask at a temperature of at least the glass-transition temperature of the glass mask, to structure the glass mask, wherein the ion implantation is carried out such that the implantation ions traverse the semiconductor body for at least 5 µm along an extension direction.

* * * * *

UNITED STATES PATENT AND TRADEMARK OFFICE
CERTIFICATE OF CORRECTION

| | | |
|---|---|---|
| PATENT NO. | : 10,615,040 B2 | Page 1 of 1 |
| APPLICATION NO. | : 15/616117 | |
| DATED | : April 7, 2020 | |
| INVENTOR(S) | : Rupp et al. | |

It is certified that error appears in the above-identified patent and that said Letters Patent is hereby corrected as shown below:

On the Title Page

Item (56), Column 2, Line 15, References Cited, Other Publications, please change "Superjunetion" to --Superjunction--.

Signed and Sealed this
Twenty-third Day of June, 2020

Andrei Iancu
*Director of the United States Patent and Trademark Office*